United States Patent
Ikeda et al.

(10) Patent No.: US 7,126,128 B2
(45) Date of Patent: Oct. 24, 2006

(54) FLAT PANEL X-RAY DETECTOR

(75) Inventors: Mitsushi Ikeda, Kawasaki (JP);
Masaki Atsuta, Yokosuka (JP);
Toshiyuki Oka, Yokohama (JP);
Kenichi Mori, Yokohama (JP); Akira Kinno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 24 days.

(21) Appl. No.: 11/052,799

(22) Filed: Feb. 9, 2005

(65) Prior Publication Data

US 2005/0253077 A1 Nov. 17, 2005

(30) Foreign Application Priority Data

| Feb. 13, 2004 | (JP) | ............................... 2004-036958 |
| Mar. 12, 2004 | (JP) | ............................... 2004-070712 |
| Mar. 12, 2004 | (JP) | ............................... 2004-070713 |

(51) Int. Cl.
*G01J 1/24* (2006.01)
*H01L 25/00* (2006.01)
*H01L 27/00* (2006.01)

(52) U.S. Cl. ............................... 250/370.09; 250/370.01

(58) Field of Classification Search ........... 250/370.01, 250/370.09, 367
See application file for complete search history.

(56) References Cited

U.S. PATENT DOCUMENTS 6,403,965 B1 * 6/2002 Ikeda et al. ............ 250/370.09
6,559,449 B1 * 5/2003 Ikeda et al. ............. 250/361 R
2004/0113087 A1 * 6/2004 Ikeda et al. ............ 250/370.09

FOREIGN PATENT DOCUMENTS

| JP | 6-128564 | 5/1994 |
| JP | 2001-320039 | 11/2001 |
| JP | 2002-289823 | 10/2002 |
| JP | 2002-303676 | 10/2002 |
| WO | WO 01/0755478 | 10/2001 |

OTHER PUBLICATIONS

Robert A. Street, et al., "X-ray imaging using lead iodide as a semiconductor detector", SPIE Conference on Physics of Medical Imaging, vol. 3659, Feb. 1999, pp. 36-47.

* cited by examiner

*Primary Examiner*—David Porta
*Assistant Examiner*—Mark R. Gaworecki
(74) *Attorney, Agent, or Firm*—Oblon, Spivak, McClelland, Maier & Neustad, P.C.

(57) ABSTRACT

A flat panel X-ray detector, including an X-ray-electric-charge converting film containing a metal halide and serving to convert an incident X-ray into an electric charge, a pair of electrodes formed on both surfaces of the X-ray-electric-charge converting film, and a blocking layer formed in contact with at least one surface of the X-ray-electric-charge converting film and containing a substance selected from the group consisting of a metal oxide, a metal nitride, a metal halide oxide, a first mixture of at least two of these materials, and a second mixture of a metal halide and any of these materials.

19 Claims, 6 Drawing Sheets

FLAT PANEL X-RAY DETECTOR

CROSS-REFERENCE TO RELATED APPLICATIONS

This application is based upon and claims the benefit of priority from prior Japanese Patent Applications No. 2004-036958, filed Feb. 13, 2004; No. 2004-070712, filed Mar. 12, 2004; and No. 2004-070713, filed Mar. 12, 2004, the entire contents of all of which are incorporated herein by reference.

BACKGROUND OF THE INVENTION

1. Field of the Invention

The present invention relates to a flat panel X-ray detector used in a medical X-ray diagnostic apparatus.

2. Description of the Related Art

In recent years, preparation of data base on the medical data on a patient is being promoted in a medical field in order to perform the medical treatment promptly and appropriately. It should be noted in this connection that the patient utilizes in general a plurality of medical organizations. Therefore, if there is no data prepared in another medical organization, there is a possibility that an appropriate medical treatment is not performed.

The data base preparation is also required in respect of the image data of the X-ray photography, and it is hoped from this point that a digital system be developed in respect of the X-ray photograph. It was customary in the past to use a silver halide film in the medical X-ray diagnostic apparatus. For employing a digital system in the medical X-ray diagnostic apparatus, it was necessary to develop the photograph film image and scan again the developed film image with a scanner, which was laborious and time-consuming.

In recent years, a system of directly converting the image into digital data has been realized by using a CCD camera sized about one inch. However, in photographing, for example, a chest, a region of about 40 cm×40 cm is photographed, making it necessary to use an optical apparatus for collecting light, leading to the problem that the apparatus is rendered bulky.

As a system for overcoming the above-noted problems inherent in the two systems described above, a flat panel X-ray detector using an amorphous silicon thin film transistor (a-Si TFT) is proposed in, for example, U.S. Pat. No. 4,689,487.

The flat panel X-ray detector proposed in the U.S. patent quoted above comprises a large number of pixels each formed of a-Si TFT, a photoconductive film and a pixel capacitor. These pixels are arranged to form an array (hereinafter referred to as a TFT array), the row of the array consisting of hundreds of to thousands of pixels and the column of the array also consisting of hundreds of to thousands of pixels.

A bias voltage is applied from a power source to the photoconductive film. The a-Si TFT is connected to a signal line and to a scanning line and is subjected to an on-off control by a scanning line driving circuit. The terminal of the signal line is connected to an amplifier for the signal detection. If X-ray light is incident on the X-ray detector, an electric current flows into the photoconductive film so as to permit the electric charge to be stored in the pixel capacitor. If the scanning line is driven by the scanning line driving circuit, all the TFTs connected to a single scanning line are turned on, with the result that the scanning line permits the stored electric charge noted above to be transferred toward the amplifier. Then, the change-over switch is changed over so as to permit the electric charge for each pixel to be sequentially amplified in the amplifier and, then, the amplified electric charge is displayed in a display device.

The system described above makes it possible to subject the output signal of the amplifier to an A/D conversion so as to obtain a digital image. The particular system is equal to a flat panel X-ray detector based on an indirect conversion system in which the incident X-ray is converted by a phosphor into a visible light and, then, the visible light is further converted into an electric charge by the photoconductive film. Also known is a flat panel X-ray detector of a direct conversion system that does not include the phosphor, in which the X-ray is converted directly into an electric charge by a photoconductive film.

In the flat panel X-ray detector of this type, it is necessary for the signal charge generated by the X-ray to be migrated promptly so as to reach the pixel electrode and to be stored in the storage capacitor section. However, where the signal charge remains inside the photosensitive film, a defective image is generated by the presence of an afterimage and the decrease of the resolution. In many cases, the defective image is generated by the situation that a signal charge remains within the photosensitive film so as to affect the flow of a signal charge that is newly generated by an X-ray. Also, where there are many defects area, an electric charge flows through the defects so as to give rise to the problem that the dark current is increased.

It is known to the art that $PbI_2$ is used for forming the X-ray-electric-charge converting film. The $PbI_2$ material is expected to exhibit excellent characteristics. However, $PbI_2$ is insufficient in its crystallinity when a thin film is actually formed by using $PbI_2$, leading to various problems such as the afterimage, the resolution deterioration and the large dark current as pointed out above. Such being the situation, a $PbI_2$ film exhibiting sufficient characteristics has not yet been achieved (see, for example, "R. A. Street et al., SPIE Vol. 3659, p. 36, 1999").

Since it is known to the art to form a blocking layer made of AsSe in contact with an X-ray-electric-charge converting film made of Se, it is conceivable to form a blocking layer of a carrier in contact with an X-ray-electric-charge converting film made of a metal halide in order to overcome the problem that the dark current is large. However, it is difficult to form a blocking layer that is low in its reactivity with a metal halide, with the result that it is difficult to form a blocking layer having an excellent interface property between the blocking layer and the X-ray-electric-charge converting film. And, a blocking layer effective for an X-ray-electric-charge converting film made of a metal halide was unknown in this technical field.

As described above, in the conventional flat panel X-ray detector, it was impossible to form a blocking layer, which was low in its reactivity with the material forming the X-ray-electric-charge converting film and which was effective for forming an interface having an excellent property between the blocking layer and the X-ray-electric-charge converting film, with the result that it was difficult to lower sufficiently the dark current of the flat panel X-ray detector.

BRIEF SUMMARY OF THE INVENTION

It is an object of the present invention to provide a flat panel X-ray detector capable of sufficiently lowering the dark current.

According to a first aspect of the present invention, there is provided a flat panel X-ray detector, comprising an X-ray-electric-charge converting film containing a metal halide and serving to convert an incident X-ray into an electric charge; a pair of electrodes formed on both surfaces of the X-ray-electric-charge converting film; and a blocking layer formed in contact with at least one surface of the X-ray-electric-charge converting film and containing a substance selected from the group consisting of a metal oxide, a metal nitride, a metal halide oxide, a first mixture of at least two of these materials, and a second mixture of a metal halide and any of theses materials.

According to a second aspect of the present invention, there is provided a flat panel X-ray detector, comprising an X-ray-electric-charge converting film containing a metal halide and serving to convert an incident X-ray into an electric charge; a pair of electrodes formed on both surfaces of the X-ray-electric-charge converting film; and a blocking layer formed in contact with at least one surface of the X-ray-electric-charge converting film, the blocking layer being formed by oxidizing the surface of the X-ray-electric-charge converting film.

Further, according to a third aspect of the present invention, there is provided a flat panel X-ray detector, comprising an X-ray-electric-charge converting film containing a halide oxide of a metal and serving to convert an incident X-ray into an electric charge; and a pair of electrodes formed on both surfaces of the X-ray-electric-charge converting film.

DETAILED DESCRIPTION OF THE INVENTION

Figure 1:
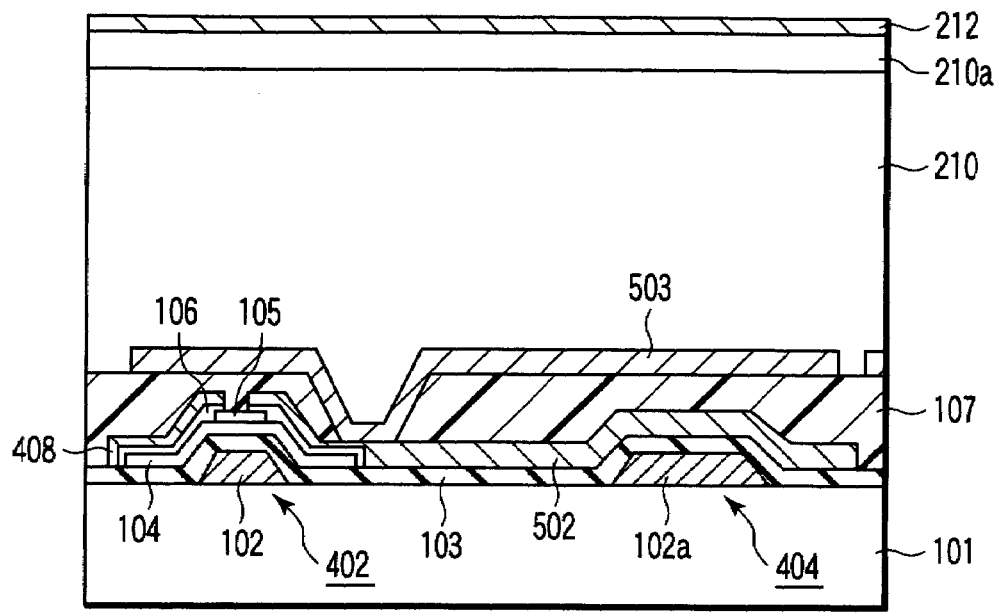
FIG. 1 is a cross sectional view showing as an example the construction of a flat panel X-ray detector according to a first embodiment of the present invention.

Some embodiments of the present invention will now be described.

The flat panel X-ray detector according to a first embodiment of the present invention is featured in that a blocking layer formed of, for example, a metal oxide film or a metal nitride film is formed in contact with an X-ray-electric-charge converting film so as to form an interface having an excellent property between the blocking layer and the X-ray-electric-charge converting film, thereby lowering the dark current of the flat panel X-ray detector. Incidentally, the blocking layer does not react with the metal halide constituting the X-ray-electric-charge converting film and exhibits sufficient chemical resistance characteristics.

In the flat panel X-ray detector according to the first embodiment of the present invention, the X-ray-electric-charge converting film may be formed of a metal halide because the metal halide exhibits a high X-ray-electric-charge converting efficiency. In order to improve the X-ray absorption efficiency, it is desirable for the metal halide constituting the X-ray-electric-charge converting film to be a material having a large X-ray absorption coefficient. It is desirable for the metal component of such a metal halide to be selected from the group consisting of Pb, Hg, Bi, Cd, In, Sn and Sb. Particularly, it is desirable to use Pb, Hg and Bi, which have a large X-ray absorption coefficient, as the metal component of the metal halide constituting the X-ray-electric-charge converting film. On the other hand, it may be desirable to use Cl, Br or I as the halogen component of the metal halide constituting the X-ray-electric-charge converting film. Particularly, it may be desirable to use I, which has a large X-ray absorption coefficient, as the halogen component of the metal halide used for forming the X-ray-electric-charge converting film.

The materials quoted above basically take a hexagonal system and have lattice constants close to each other. Since the hexagonal system exhibits a high resistivity in the c-axis direction, it is possible to lower the dark current. As a result, it is possible to detect fine signals so as to improve the performance of the flat panel X-ray detector.

In $BiI_3$ etc. among the metal halides used for forming the X-ray-electric-charge converting film in the first embodiment of the present invention, the hexagonal structure partly lacks metal atoms in the iodine (I) atoms. However, in spite of the partial lack of the metal atoms, the hexagonal structure produces an effect of the lattice alignment substantially equal to that produced by the complete hexagonal structure. It is possible to obtain an X-ray-electric-charge converting film of a high quality by using a material assuming the values close to these lattice constants.

The blocking layer that is formed in contact with the X-ray-electric-charge converting film is formed of a material selected from the group consisting of a metal oxide, a metal nitride, a metal halide oxide, a first mixture of at least two of these materials, and a second mixture of a metal halide and any of these materials. In this case, the first mixture includes other materials than a metal halide.

In this case, it may be desirable for the metals forming the metal oxide, the metal nitride and the metal halide oxide constituting the blocking layer to be equal to the metals forming the metal halide constituting the X-ray-electric-charge converting film. Where the oxide, nitride and halide oxide of the metal equal to the metal forming the metal halide constituting the X-ray-electric-charge converting film is used for forming the blocking layer, it is possible to obtain an interface having good matching properties between the X-ray-electric-charge converting film and the blocking layer and, thus, it is possible to obtain good blocking characteristics. Since the halide and the oxide or the like have the same metal atom, good matching properties can be obtained between the X-ray-electric-charge converting film and the blocking layer so as to make it possible to obtain good blocking characteristics as pointed out above. It follows that it is possible to lower the dark current without deteriorating the X-ray sensitive characteristics.

In order to form the metal oxide and the metal halide oxide, it may be desirable to oxidize the metal halide. Also, it may be desirable to nitride the metal halide in order to form the metal nitride. By employing these methods, it is possible to form an interface having an excellent property between the X-ray-electric-charge converting film and the blocking layer. Incidentally, a gaseous phase method such as a vapor deposition method and the CVD method can also be employed for forming the blocking layer in place of the oxidizing method and the nitriding method noted above.

As described above, in the flat panel X-ray detector according to the first embodiment of the present invention, a prescribed blocking layer is formed in contact with the X-ray-electric-charge converting film, with the result that it is possible to form an interface having an excellent property between the X-ray-electric-charge converting film and the blocking layer. It follows that it is possible to obtain good blocking effects and to obtain a prominent effect of lowering the dark current. It should also be noted that, since the characteristics of the X-ray-electric-charge converting film are also improved, it is possible to improve the yield of the film formation. In conclusion, according to the first embodiment of the present invention, it is possible to obtain a flat panel X-ray detector of a high performance having a wide dynamic range with a high efficiency.

The flat panel X-ray detector according to a second embodiment of the present invention is featured in that a halide oxide of a metal is used for forming the X-ray-electric-charge converting film because a halide oxide of a metal, particularly, Pb, Hg, Tl, Bi, Cd, In, Sn and Sb, exhibits a high sensitivity to the X-ray. The X-ray-electric-charge converting film known to the art in the past was formed of an iodide of Pb, Hg, Tl, Bi, Cd or In. However, the metal iodide is mechanically weak and, thus, it is difficult to handle the metal iodide film. Also, the metal iodide has a large thermal expansion coefficient and, thus, tends to peel off from the substrate such as a glass substrate. On the other hand, the metal iodide oxide has a high mechanical strength, compared with the iodide of the same metal, is chemically stable, and has a small thermal expansion coefficient, with the result that the metal iodide oxide has a high adhesive force to the substrate. The metal iodide oxide used in the second embodiment according to the present invention includes, for example, $BiI_xO_y$, where x and y fall within the ranges of $3>x>0$, $1.5>y>0$.

$BiI_xO_y$ has a large X-ray absorption coefficient and, thus, is adapted for use as an X-ray sensitive material. Also, Sb, In and Pb, which have a large X-ray absorption coefficient, can be used as the metal components forming the metal iodide oxide. When it comes to the halogen component of the metal halide oxide, it may be desirable to use iodine (I) that has a large X-ray absorption coefficient. However, it is also possible to use Cl and Br as the halogen component of the metal halide oxide.

Various Examples of the present invention will now be described. Needless to say, the technical scope of the present invention is not limited at all by the following Examples.

Examples 1 to 7 given below relate to the first embodiment of the present invention.

EXAMPLE 1

FIG. 1 is a cross sectional view showing the construction of the pixel of the flat panel X-ray detector according to Example 1. The method of forming the flat panel X-ray detector according to Example 1 will now be described with reference to FIG. 1.

In the first step, a single layer film consisting of, for example, MoTa, Ta, TaN, Al, an Al alloy, Cu or MoW, or a film of two layers consisting of a Ta layer and a $TaN_x$ layer, was deposited on a glass substrate 101 in a thickness of about 300 nm, followed by patterning the deposited film by the etching method so as to form a gate electrode 102 of a switching TFT 402, a scanning line (not shown), an electrode 102a of a storage capacitor 404, and a storage capacitor line (not shown).

In the next step, a $SiO_x$ film and a $SiN_x$ film were deposited in a thickness of about 300 nm and about 50 nm, respectively, by a plasma CVD method so as to form an insulating film 103 of a laminate structure on the entire surface, followed by depositing an undoped a-Si layer 104 in a thickness of about 100 nm and subsequently depositing a stopper 105 formed of $SiN_x$ in a thickness of about 200 nm.

The stopper 105 was patterned in aligned with the gate electrode 102 by a back exposure method. Then, an $n^+$-type a-Si layer 106 was deposited in a thickness of about 50 nm on the patterned stopper 105, followed by etching the a-Si layer 104 and the $n^+$-type a-Si layer 106 in conformity with the shape of a transistor so as to form an island consisting of a-Si.

After formation of the a-Si island, the insulating film 103 was etched in the contact portions both inside and outside the pixel area so as to form contact holes. Then, a laminate structure consisting of a Mo layer, an Al layer, and an additional Mo layer was formed by a sputtering method on the insulating film 103 having contact holes formed therein. To be more specific, the Mo layer and the Al layer were successively formed in a thickness of about 50 nm and about 350 nm, respectively, so as to form a laminate structure, followed by forming the additional Mo layer in a thickness of about 20 nm to about 50 nm on the Al layer so as to form an auxiliary electrode 502, a signal line 408, the source and drain of the TFT 402, and other wirings.

In the next step, a $SiN_x$ film was deposited in a thickness of about 200 nm, followed by depositing an acrylic organic resin film (HRC: trade name, manufactured by Nippon Synthetic Rubber Inc.) in a thickness of about 1 to 5 µm, preferably about 3.5 µm, so as to form a protective film 107 of a laminate structure. Incidentally, it is possible to use BCB (benzocyclobutene resin) in place of HRC for forming the organic resin film.

Then, a contact hole leading to the auxiliary electrode 502 was formed in the protective film 107, followed by forming an ITO film to be used as a pixel electrode. The ITO film was formed in a thickness of 100 nm by a sputtering method with ITO used as a target, followed by patterning the ITO film so as to obtain a pixel electrode 503. Incidentally, the ITO film can be formed by other methods such as a vapor deposition method. Also, it is possible for ITO to be either amorphous or polycrystalline.

In the next step, a $BiI_3$ film 210 having a high resistivity and used as an X-ray-electric-charge converting film was formed by a vapor deposition method on the pixel electrode 503 in a thickness of about 100 to 1,000 µm, preferably 300

μm. Then, the surface of the $BiI_3$ film 210 was oxidized so as to form a bismuth oxide film 210a used as a blocking layer. The bismuth oxide film 210a can be formed by the thermal oxidation that is carried out under an atmosphere containing an oxygen gas. Alternatively, it is also possible to process the $BiI_3$ film 210 within water or an aqueous solution so as to oxidize the surface of the $BiI_3$ film 210. Any kind of the aqueous solution can be used for the oxidation as far as the aqueous solution contains water. Also, the process temperature falls within a range of between room temperature and 100° C. Further, for forming the bismuth oxide film 210a, it is also possible to process the $BiI_3$ film 210 within a gas plasma containing oxygen so as to oxidize the surface of the $BiI_3$ film 210.

Further, a Pd layer was deposited in a thickness of 200 nm on the bismuth oxide film 210a thus obtained. The Pd layer was deposited substantially on the entire surface of the region that was 1 cm apart from the periphery of the bismuth oxide film 210a so as to form an upper electrode 212.

Figure 5:
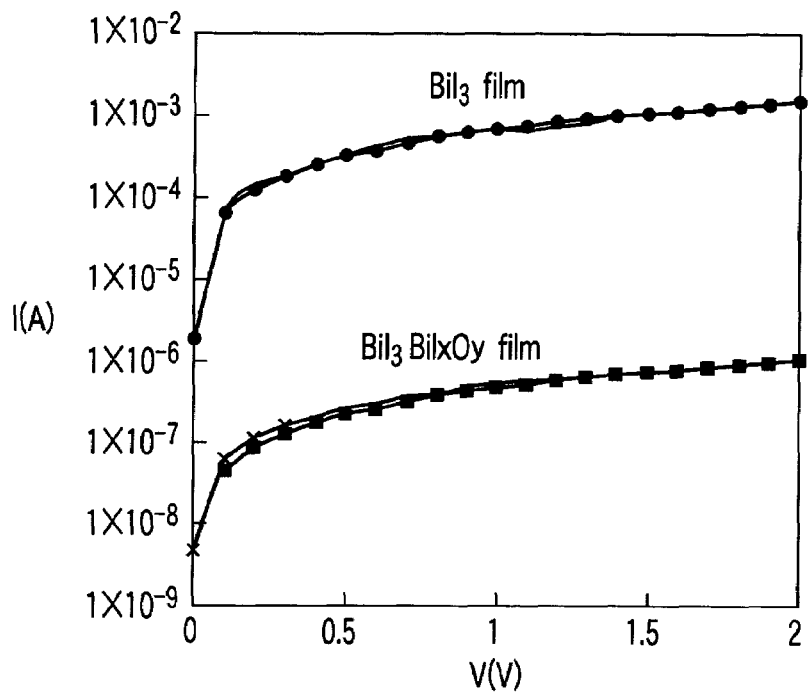
FIG. 5 is a graph showing an improvement in the dark current according to another example of the flat panel X-ray detector according to the first embodiment of the present invention.

A flat panel X-ray detector was prepared by forming a voltage-applying electrode on the upper electrode 212 so as to obtain a TFT array X-ray-electric-charge converting film substrate, followed by mounting a peripheral driving circuit to the TFT array X-ray-electric-charge converting film substrate thus obtained. An X-ray image was detected by using thus prepared flat panel X-ray detector. As a result, the dark current was lowered to $1/10$ to $1/1,000$ as shown in FIG. 5 so as to obtain a good SN ratio. The image quality was also found to be satisfactory.

Incidentally, the dark current can be lowered by applying a bias of any polarity to the pixel electrode 503 and the upper electrode 212. However, the dark current can be markedly lowered in the case of applying a negative voltage to the upper electrode 212, which is an electrode on the side of the bismuth oxide film 210a used as the blocking layer.

In the flat panel X-ray detector according to Example 1, the surface region of the $BiI_3$ film 210 acting as the X-ray-electric-charge converting film was oxidized into the bismuth oxide film 210a which was substantially formed of $BiO_x$ and acted as the blocking layer. The intermediate region below the bismuth oxide film 210a, which was certainly oxidized, was formed of $BiI_xO_y$, and the inner region of the $BiI_3$ film 210 acting as the X-ray-electric-charge converting film remained to be formed of $BiI_3$. What should be noted is that the blocking layer included the $BiO_x$ layer 210a and the $BiI_xO_y$ intermediate layer. It has been found that the particular construction of the blocking layer permits producing the prominently satisfactory characteristics. To be more specific, it has been found that the blocking layer including the $BiI_xO_y$ intermediate layer having a thickness of 0.1 to 10 μm permits producing a prominent effect. Also, the surface oxide layer having a thickness of 0.3 to 3 μm has been found to be particularly effective, though the thickness of the surface oxide layer depends on the forming method of the oxide film. It is considered reasonable to understand that the interfacial characteristics are rendered satisfactory because a partially oxidized $BiI_xO_y$ layer is formed between the $BiO_x$ layer and the $BiI_3$ layer so as to produce the prominent effect described above.

It should be noted that it is possible for the surface of the $BiI_3$ film 210 to be oxidized completely so as to form the $BiO_x$ film 210a. Also, it is possible for bismuth iodide oxide ($BiI_xO_y$) to be contained in the surface region itself formed of the bismuth oxide film 210a. In this case, it is desirable for the molar ratio of iodine (I) to be larger than the molar ratio of oxygen (O). In other words, it is desirable for x to be not smaller than y ($x \geq y$) in the expression of $BiI_xO_y$.

The metal iodide oxide was also found to exhibit a blocking effect even in the case where the X-ray-electric-charge converting film was formed of a metal iodide other than $BiI_3$ and, thus, found to be effective for lowering the dark current. To be more specific, a similar effect was obtained in the case where the X-ray-electric-charge converting film was formed of $InI_x$ (x=1 or 3), $PbI_2$, $HgI_2$, or $SnI_2$. Incidentally, since $PbI_2$ and $SnI_2$ are slightly soluble in water, the oxidizing method utilizing the thermal oxidation and plasma oxidation was found to be more effective. It should be noted, however, that, since it is acceptable for the shallow surface region of the $PbI_2$ layer or the $SnI_2$ to be dissolved, it was found possible to employ the oxidizing method utilizing the processing with an aqueous solution.

EXAMPLE 2

Figure 2:
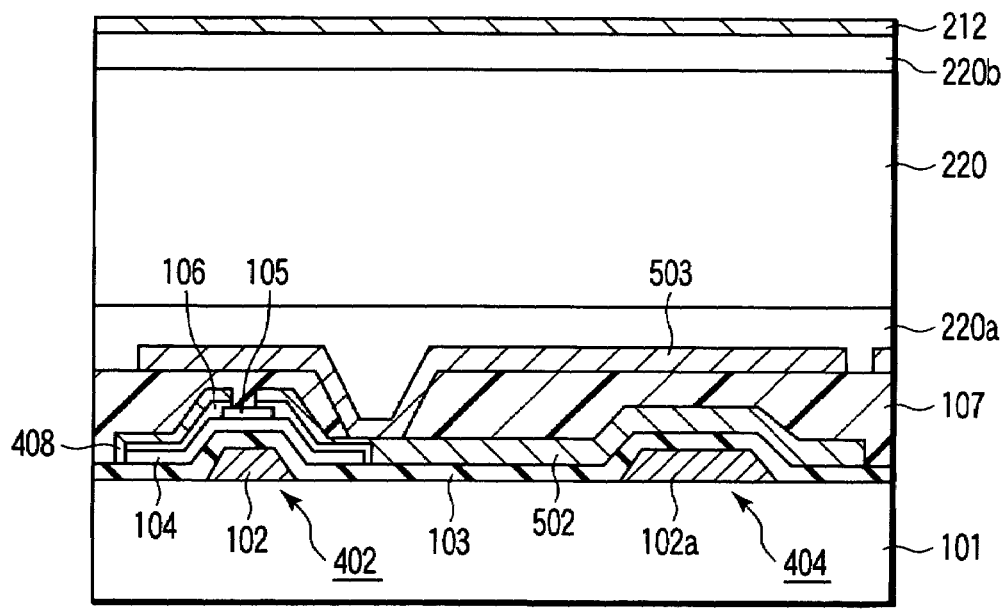
FIG. 2 is a cross sectional view showing another example of the flat panel X-ray detector according to the first embodiment of the present invention.

FIG. 2 is a cross sectional view showing the construction of a pixel of a flat panel X-ray detector according to Example 2. The method of forming the flat panel X-ray detector for Example 2 will now be described with reference to FIG. 2.

As in Example 1, a switching TFT 402 and a storage capacitor 404 were formed on a glass substrate 101, followed by forming a pixel electrode 503 on a protective film 107 that was formed before formation of the pixel electrode 503. To be more specific, the pixel electrode 503 was formed by forming a Ti layer in a thickness of 30 nm by a sputtering method and subsequently forming a Pd layer on the Ti layer by a sputtering method in a thickness of 200 nm, followed by patterning the laminate structure consisting of the Ti layer and the Pd layer thus formed.

In the next step, a $BiO_x$ layer 220a acting as a blocking layer was formed in a thickness of 1 to 10 μm, preferably 3 μm, by a vapor deposition method on the pixel electrode 503. Then, a $BiI_3$ film 220 acting as an X-ray-electric-charge converting film was formed on the $BiO_x$ film 220a in a thickness of 300 μm by a vapor deposition method. Further, a $Bi_xS_yI$ film 220b having a high resistivity was formed on the $BiI_3$ film 220 by a vapor deposition method in a thickness of about 1 to 100 μm, preferably 10 μm. The film-forming temperature was 250° C. In the $BiI_3$ film and the $Bi_xS_yI$ film, the x-axes of the hexagonal system were oriented in a direction perpendicular to the substrate.

Further, an upper electrode 212 consisting of Cr was formed on the $Bi_xS_yI$ film 220b so as to obtain a TFT array X-ray-electric-charge converting film substrate.

An X-ray image was detected by using a flat panel X-ray detector that was obtained by mounting a peripheral driving circuit to the TFT array X-ray-electric-charge converting film substrate thus obtained. As a result, the dark current was lowered to $1/10$ to $1/1,000$ so as to obtain a good SN ratio, compared with the case where the $BiO_x$ layer 220a was not formed as the blocking layer, as shown in FIG. 5. It was also possible to obtain an image having an excellent image quality. It is considered reasonable to understand that, since the oxide and the iodide of the same metal were used for forming the blocking layer and the X-ray-electric-charge converting film, an interface having an excellent property was formed between the blocking layer and the X-ray-electric-charge converting film so as to produce the prominent effect noted above. It should also be noted that the thermal expansion coefficient of $BiO_x$ is smaller than that of $BiI_3$ and is close to the thermal expansion coefficient of the glass substrate, with the result that the peeling of the film was decreased, and the adhesive force of the blocking layer to the glass substrate was increased. Incidentally, it is not absolutely necessary to form the $Bi_xS_yI$ film 220b on the $BiI_3$ film 220.

In Example 2, a $BiI_3$ film was used as the X-ray-electric-charge converting film. However, the material of the X-ray-electric-charge converting film is not limited to $BiI_3$. It is also possible to use, for example, metal iodides such as $PdI_2$, $HgI_2$, $InI$, or $SnI_2$ for forming the X-ray-electric-charge converting film. As described above, it is possible to lower the dark current of the flat panel X-ray detector by forming on the pixel electrode a blocking layer consisting of the oxide of the metal equal to the metal of the metal iodide forming the X-ray-electric-charge converting film. Also, since the interface between the metal oxide layer constituting the blocking layer and the metal iodide layer constituting the X-ray-electric-charge converting film exhibits good matching properties, the sensitivity was scarcely lowered so as to obtain a good SN ratio. Also, since the metal oxide forming the blocking layer 220a exhibits a thermal expansion coefficient close to that of the glass substrate, it was possible to obtain an additional effect that the peeling of the film was lowered.

Incidentally, since the dark current is decreased in a direction equal to the direction applying a bias, it is desirable to apply a bias having a polarity in the direction in which the dark current is decreased.

EXAMPLE 3

Figure 3:
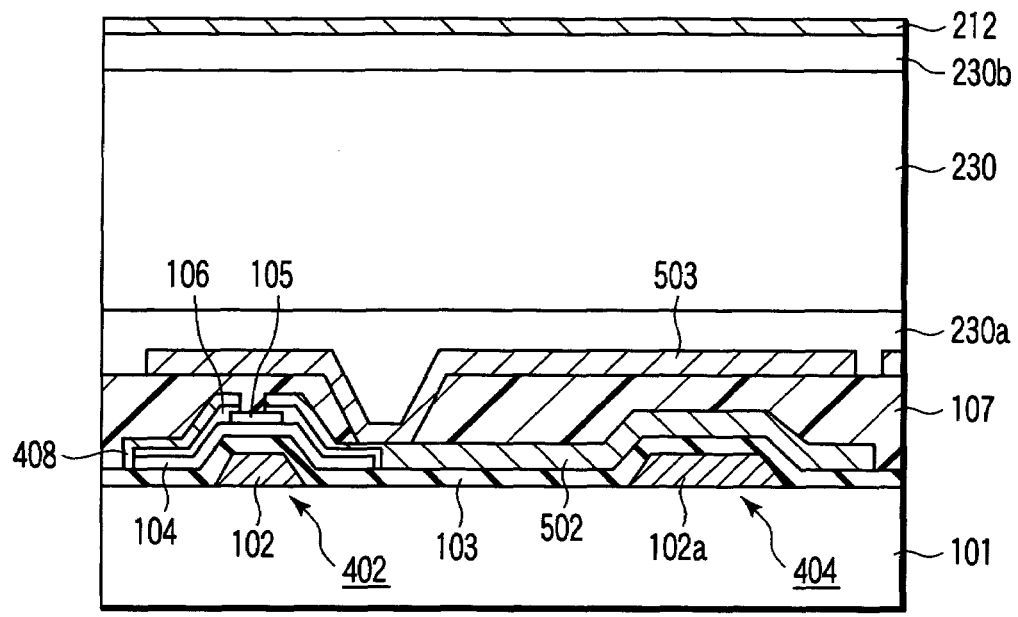
FIG. 3 is a cross sectional view showing another example of the flat panel X-ray detector according to the first embodiment of the present invention.

FIG. 3 is a cross sectional view showing the construction of a pixel of a flat panel X-ray detector for this Example. The method of forming the flat panel X-ray detector for Example 3 will now be described with reference to FIG. 3.

As in Example 1, a switching TFT 402 and a storage capacitor 404 were formed on a glass substrate 101, followed by forming a pixel electrode 503 on a protective film 107 that was formed before formation of the pixel electrode 503. To be more specific, the pixel electrode 503 was formed by forming first a Ti layer by a sputtering method in a thickness of 30 nm and, then, forming a Pd layer on the Ti layer by a sputtering method in a thickness of 200 nm, followed by patterning the laminate structure consisting of the Ti layer and the Pd layer thus formed.

In the next step, a $PbO_x$ layer 230a used as a blocking layer was formed on the pixel electrode 503 by a vapor deposition method in a thickness of 1 to 10 μm, preferably 2 μm. Then, a $PbI_2$ film 230 used as an X-ray-electric-charge converting film was formed on the $PbO_x$ layer 230a in a thickness of 300 μm. Further, a $Pb_xBi_yI$ film 230b having a high resistivity and used as a blocking layer was formed by a vapor deposition method on the $PbI_2$ film 230 in a thickness of about 1 to 100 μm, preferably 10 μm. The film-forming temperature was 250° C. In the $PbI_2$ film 230 and the $Pb_xBi_yI$ film 230b thus formed, the c-axes of the hexagonal system were found to be oriented in a direction perpendicular to the substrate.

Further, an upper electrode 212 consisting of Cr was formed on the $Pb_xBi_yI$ film 230b so as to obtain a TFT array X-ray-electric-charge converting film substrate.

A flat panel X-ray detector was obtained by mounting a peripheral driving circuit to the TFT array X-ray-electric-charge converting film substrate. An X-ray image was detected by using thus formed flat panel X-ray detector. As a result, the dark current was lowered to 1/10 to 1/1,000 so as to obtain a good SN ratio, compared with the case where the $PbO_x$ layer 230a was not formed as the blocking layer. It was also possible to obtain an image having an excellent image quality. It is considered reasonable to understand that, since the oxide and the iodide of the same metal were used for forming the blocking layer and the X-ray-electric-charge converting film, an interface having an excellent property was formed between the blocking layer and the X-ray-electric-charge converting film so as to produce the prominent effect noted above. It should also be noted that the thermal expansion coefficient of $PbO_x$ is smaller than that of $PbI_2$ and is close to the thermal expansion coefficient of the glass substrate, with the result that the peeling of the film from the glass substrate was decreased, and the adhesive force of the blocking layer was increased. Incidentally, it is not absolutely necessary to form the $Pb_xBi_yI$ film 230b on the $PbI_2$ film 230.

In Example 3, a $PbI_2$ film was used as the X-ray-electric-charge converting film. However, the material of the X-ray-electric-charge converting film is not limited to $PbI_2$. It is also possible to use, for example, metal iodides such as $HgI_2$, $BiI_3$, $InI$, or $SnI_2$ for forming the X-ray-electric-charge converting film. As described above, it is possible to lower the dark current of the flat panel X-ray detector by forming on the pixel electrode 503 a blocking layer consisting of the oxide of the metal equal to the metal component of the metal iodide forming the X-ray-electric-charge converting film. Also, since the interface between the metal oxide layer constituting the blocking layer and the metal iodide layer constituting the X-ray-electric-charge converting film exhibits good matching properties, the sensitivity was scarcely lowered so as to obtain a good SN ratio. Also, since the blocking layer exhibits a thermal expansion coefficient close to that of the glass substrate, it was possible to obtain an additional effect that the peeling of the film was lowered.

EXAMPLE 4

Figure 4:
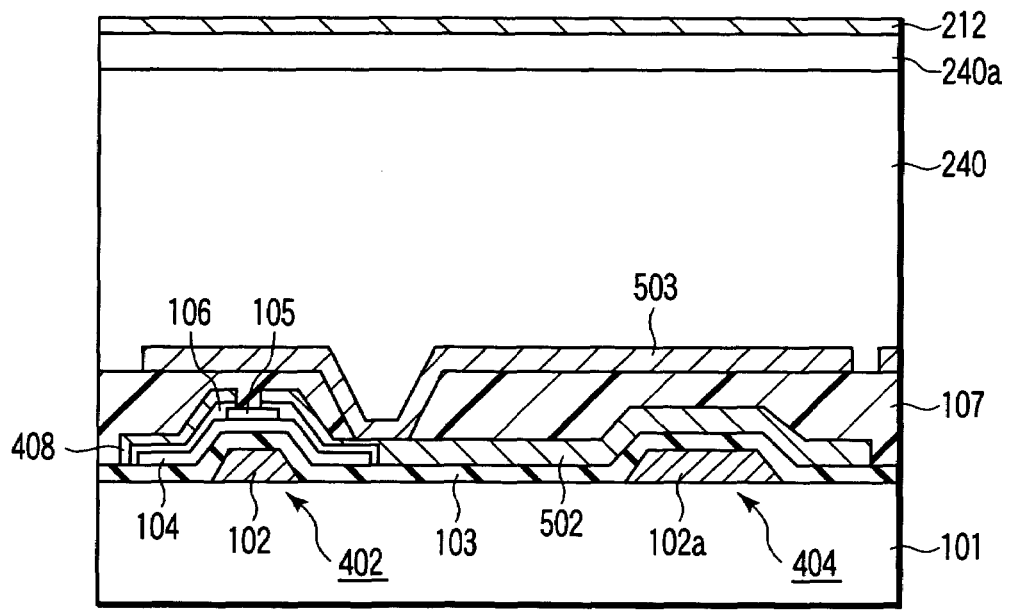
FIG. 4 is a cross sectional view showing another example of the flat panel X-ray detector according to the first embodiment of the present invention.

FIG. 4 is a cross sectional view showing the construction of a pixel of a flat panel X-ray detector for this Example. The method of forming the flat panel X-ray detector for Example 4 will now be described with reference to FIG. 4.

As in Example 1, a switching TFT 402 and a storage capacitor 404 were formed on a glass substrate 101, followed by forming a pixel electrode 503 on a protective film 107 that was formed before formation of the pixel electrode 503. To be more specific, the pixel electrode 503 was formed by forming successively a Ti layer and a Pd layer by a sputtering method in a thickness of 30 nm and 200 nm, respectively, so as to form a laminate structure, followed by patterning the laminate structure consisting of the Ti layer and the Pd layer thus formed.

In the next step, a $Bi_xPb_yI_z$ film 240 having a high resistivity was formed as an X-ray-electric-charge converting film on the pixel electrode 503 in a thickness of about 100 to 1,000 μm, preferably 300 μm. Then, a BiPb oxide film 240a used as a blocking layer was formed by oxidizing the surface region of the $Bi_xPb_yI_z$ film 240. The BiPb oxide film 240a can be formed by the thermal oxidation method that is carried out within an atmosphere containing an oxygen gas. Alternatively, it is possible to oxidize the surface of the $Bi_xPb_yI_z$ film 240 within water or an aqueous solution so as to obtain the BiPb oxide film 240a. Any kind of the aqueous solution can be used as far as the aqueous solution contains water. The oxidizing treatment can be carried out under temperatures falling within a range of between room temperature and 100° C. Also, it is possible to oxidize the surface of the $Bi_xPb_yI_z$ film 240 by a treatment that is carried out within a gas plasma containing oxygen.

Further, a Pd layer was deposited in a thickness of 200 nm on the BiPb oxide film thus formed. The Pd layer was deposited substantially on the entire surface of a region 1 cm apart from the periphery of the BiPb oxide film 240a so as to form an upper electrode 212.

A flat panel X-ray detector was obtained by forming a voltage-applying electrode on the upper electrode 212 so as to obtain a TFT array X-ray-electric-charge converting film substrate, followed by mounting a peripheral driving circuit to the TFT array X-ray-electric-charge converting film substrate. An X-ray image was detected by using thus formed flat panel X-ray detector. As a result, the dark current was lowered to $1/10$ to $1/1,000$ so as to obtain a good SN ratio. It was also possible to obtain an image having an excellent image quality.

Incidentally, the dark current can be lowered by applying a bias of any polarity to the pixel electrode 503 and the upper electrode 212. Particularly, the dark current can be lowered markedly in the case of applying a negative voltage to the upper electrode 212, which is an electrode on the side of the BiPb oxide film 240a.

In the flat panel X-ray detector for Example 4, the surface region of the $Bi_xPb_yI_z$ film 240 forming the BiPb oxide film 240a constituting the blocking layer is substantially formed of $BiPbO_x$, and the intermediate layer below the surface region is partially oxidized into $Bi_xPb_yI_zO_u$. Further, the inner region of the $Bi_xPb_yI_zO_u$ film 240 remains to be formed of $Bi_xPb_yI_z$. In other words, the blocking layer includes the partially oxidized $Bi_xPb_yI_zO_u$ intermediate layer. The particular construction was found to produce the particularly prominent characteristics.

In Example 4, the X-ray-electric-charge converting film was formed of a mixture of $BiI_x$ and $PbI_y$ so as to permit the blocking layer formed of the metal iodide oxide to exhibit a blocking effect, with the result that the dark current was lowered. The particular effect was also found even in the case where the X-ray-electric-charge converting film was formed of a mixture of other metal iodides. To be more specific, the similar effect was produced in the case of oxidizing the surface of the X-ray-electric-charge converting film formed of a mixture of at least two metal iodides selected from the group consisting of $InI_x$, $PbI_x$, $HgI_x$, and $SnI_x$.

It should be noted that there is a direction in which the dark current is decreased depending on the applying direction of the bias. Therefore, it is desirable to apply a bias having a polarity in the direction in which the dark current is decreased.

In each of the Examples described above, the blocking layer was formed of the oxide of the metal equal to the metal component of the metal iodide constituting the X-ray-electric-charge converting film. However, the material of the blocking layer is not limited to the oxide of the particular metal. Specifically, it is also possible to lower similarly the dark current of the flat panel X-ray detector in the case of using a nitride of the metal equal to the metal component of the metal iodide, a mixture of the particular oxide and the particular nitride, or a mixture of the particular oxide or the particular nitride and a metal iodide oxide.

Also, the X-ray sensitive material constituting the X-ray-electric-charge converting film is not limited to a metal iodide. In other words, an optional metal halide can be used in the present invention for forming the X-ray-electric-charge converting film.

EXAMPLE 5

Figure 6:
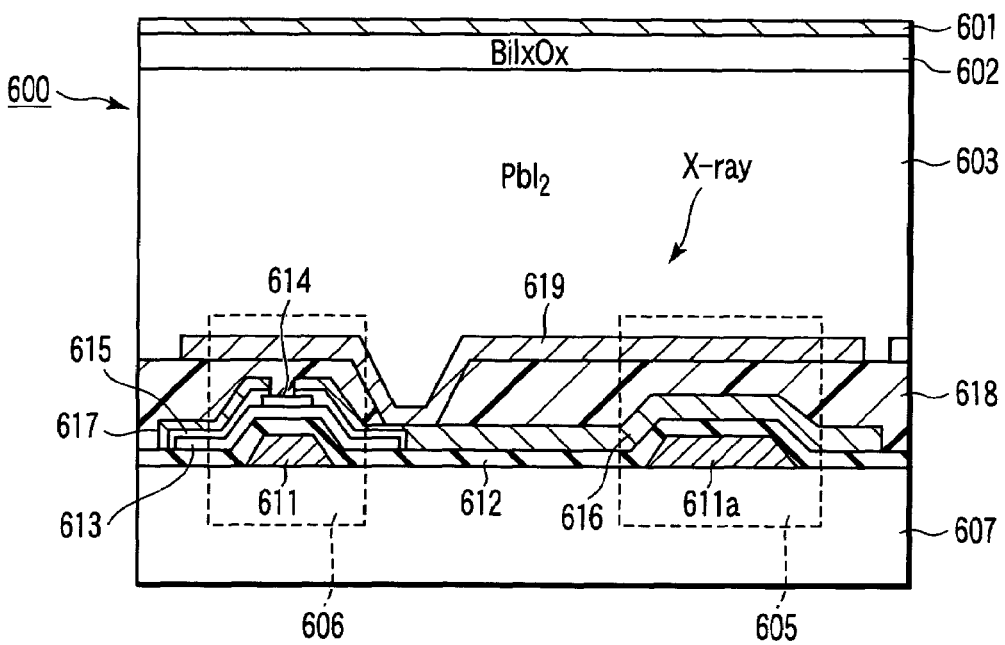
FIG. 6 is a cross sectional view showing another example of the flat panel X-ray detector according to the first embodiment of the present invention.
Figure 7:
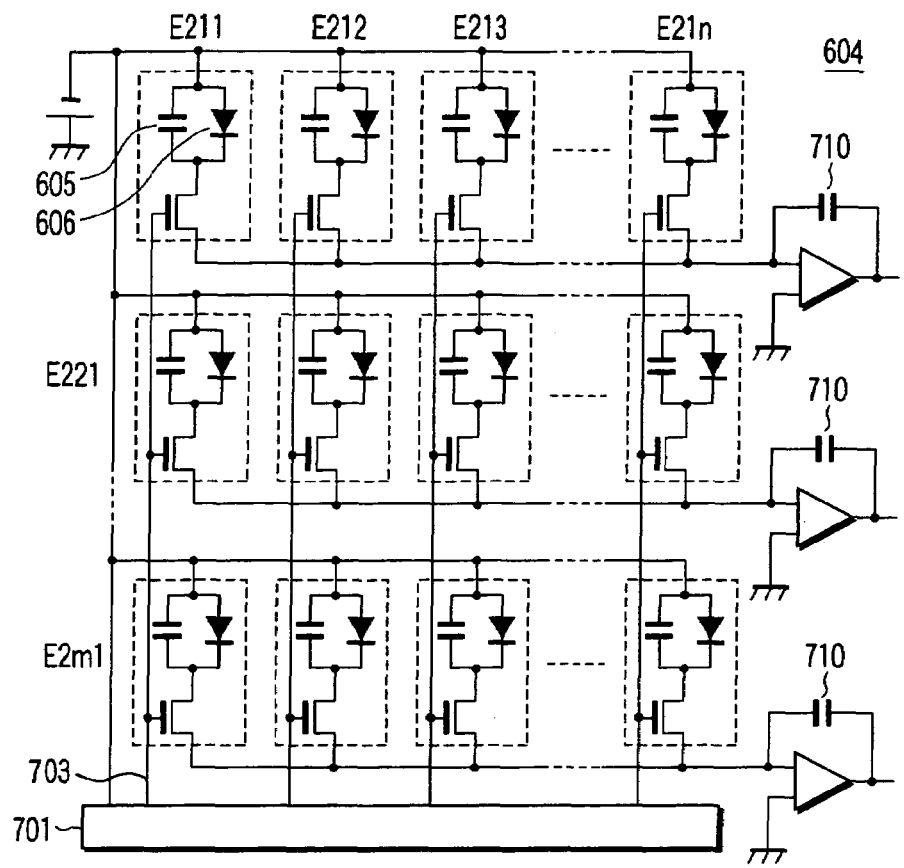
FIG. 7 shows the driving circuit of a flat panel X-ray detector according to the first embodiment of the present invention.

FIG. 6 is a cross sectional view showing the construction of a flat panel X-ray detector 600 for this Example, and FIG. 7 shows the signal detecting circuit of the flat panel X-ray detector. The flat panel X-ray detector 600 comprises an upper electrode 601 formed on the upper surface, a blocking film 602 formed below the upper electrode 601, an X-ray-electric-charge converting film 603 formed below the blocking film 602, and a signal detecting circuit 604 formed below the X-ray-electric-charge converting film 603. As shown in FIG. 7, the signal detecting circuit 604 has an m×n matrix arrangement.

The X-ray incident from above the upper electrode 601 passes through the upper electrode 601 and the blocking layer 602 so as to be converted into an electric charge within the X-ray-electric-charge converting film 603. The amount of the converted electric charge corresponds to the amount of the X-ray introduced into the X-ray-electric-charge converting film 603. The electric charge thus converted is stored in each of capacitors 605. The electric charge stored in these capacitors 605 is successively taken out to the outside through a corresponding TFT 606 by driving a shift register 701 shown in FIG. 7 and the other shift registers that are not shown in the drawing. To be more specific, the electric charge can be taken out as the output signal of an amplifier 710 by sequentially applying clock signals to the column scanning line by selecting any of the row scanning lines 703 connected to the shift register 701.

The method of manufacturing the flat panel X-ray detector for this Example will now be described with reference to FIG. 6. In the first step, a single layer film made of, for example, MoTa, Ta, TaN, Al, an Al alloy, Cu, or MoW, or a film of two layers made of Ta and $TaN_x$, respectively, was deposited in a thickness of about 300 nm on a glass substrate 607, followed by selectively etching the deposited film so as to pattern the film. As a result, formed were a gate electrode 611 of a switching TFT 606, a scanning line (not shown), a capacitor electrode 611a of a capacitor 605, and a capacitor line (not shown). A reference numeral 607 shown in FIG. 6 denotes a glass substrate.

In the next step, a $SiO_x$ film and a $SiN_x$ film were successively deposited in a thickness of about 300 nm and about 50 nm, respectively, by a plasma CVD method so as to form an insulating film 612 of a laminate structure on the entire surface. Then, an undoped a-Si layer 613 was deposited on the insulating film 612 in a thickness of about 100 nm, followed by depositing a $SiN_x$ film on the undoped a-Si layer 613 in a thickness of about 200 nm so as to form a stopper 614.

The stopper 614 was patterned by a back exposure method to conform with the gate electrode 611, followed by depositing an n$^+$-type a-Si layer 615 on the patterned stopper 614 in a thickness of about 50 nm. Further, the undoped a-Si layer 613 and the n$^+$-type a-Si layer 615 were selectively etched in conformity with the shape of the transistor so as to form an a-Si island.

In the next step, the insulating film 612 in the contact portions both inside and outside the pixel area was selectively etched so as to form contact holes. Then, a Mo layer about 50 nm thick, an Al layer about 350 nm thick, and an additional Mo layer about 20 nm to about 50 nm thick were successively laminated one upon the other by a sputtering method so as to form an auxiliary electrode 616, a signal line 617, a source-drain of the switching TFT 606, and the other wirings.

In the next step, a SiN$_x$ film was deposited in a thickness of about 200 nm, followed by depositing on the SiN$_x$ film an acrylic organic resin film (HRC: trade name, manufactured by Nippon Synthetic Rubber Inc.) in a thickness of about 1 µm to about 5 µm, preferably about 3.5 µm, so as to form a protective film 618 of a laminate structure. Incidentally, it is possible to use BCB (benzocyclobutene resin) in place of HRC for forming the organic resin film.

After formation of the contact hole leading to the auxiliary electrode 616, an ITO film was formed in a thickness of 100 nm by a sputtering method with ITO used as a target, followed by patterning the ITO film so as to obtain a pixel electrode 619.

The ITO film can be formed by another method such as a vapor deposition method. Also, it is possible for the ITO to be either amorphous or polycrystalline.

In the next step, a PbI$_2$ film having a high resistivity and forming the X-ray-electric-charge converting film 603 was formed on the pixel electrode 619 by a vapor deposition method in a thickness of about 100 to 1,000 nm, preferably about 300 nm. Then, a BiI$_3$ film was formed in a thickness of 3 µm on the surface of the PbI$_2$ film, followed by oxidizing the BiI$_3$ film so as to form a BiI$_x$O$_y$ film used as the blocking film 602. It is possible for the process temperature to fall within a range of between room temperature and 150° C. The BiI$_x$O$_y$ film was formed by the thermal oxidation method that was carried out under an atmosphere containing an oxygen gas. Alternatively, it is also possible to form the BiI$_x$O$_y$ film by oxidizing the surface of the BiI$_3$ film by a treatment that is carried out within water or an aqueous solution. Any kind of the aqueous solution can be used for this treatment as far as water is contained in the aqueous solution. Also, it is possible for the process temperature to fall within a range of between room temperature and 100° C. Further, it is possible to oxidize the surface of the BiI$_3$ film by a treatment that is carried out within a gas plasma containing oxygen.

Further, a Pd layer was deposited in a thickness of 200 nm on the blocking film 602 thus formed. The Pd layer was deposited substantially on the entire surface of a region that was 1 cm apart from the periphery of the oxide film of BiI$_3$ so as to form the upper electrode 601.

A flat panel X-ray detector was prepared by forming a voltage-applying electrode on the upper electrode 601 so as to form a TFT array X-ray-electric-charge converting film substrate, followed by mounting the peripheral circuit as shown in FIG. 7 to the TFT array X-ray-electric-charge converting film substrate. An X-ray image was detected by using thus formed flat panel X-ray detector. As a result, the dark current was found to be lowered so as to obtain a good SN ratio. Also, it was possible to obtain an X-ray image of a good image quality.

The dark current was lowered regardless of the polarity of the bias. Particularly, it was found effective to apply a negative voltage to the electrode of the oxide film of BiI$_3$ because the dark current was markedly lowered in this case.

Incidentally, it is possible for the surface of the flat panel X-ray detector to be oxidized completely. It is also possible for the surface noted above to be in form of a Bi iodide oxide.

It is desirable for the molar ratio of O on the uppermost surface of the oxide film of BiI$_3$ to be larger than that of I. In other words, where the uppermost surface of the oxide film of BiI$_3$ is represented by BiI$_x$O$_y$, it is desirable for the value of y to be not smaller than the value of x, i.e., y≧x. In the case of BiI$_x$O$_y$ was BiIO, i.e., where x=y=1, films with (110) orientation and the (200) orientation relative to the substrate or a mixture thereof were found to indicate good characteristics because the dark current was lowered. The dark current was blocked effectively in the case where the thickness of the BiI$_x$O$_y$ layer fell within a range of between 1 µm and 50 µm. The dark current blocking effect was particularly prominent in the case where the thickness of the BiI$_x$O$_y$ layer fell within a range of between 3 µm and 10 µm.

BiO$_y$ is stable and is less reactive with a metal, with the result that the interfaces of the BiO$_y$ film with the metal electrode and with the metal oxide of ITO were found to be stable so as to improve the reliability of the flat panel X-ray detector.

In the present invention, the Bi iodide oxide was found to produce a blocking effect relative to the other X-ray sensitive films and, thus, found to be effective for lowering the dark current. In the present invention, the similar effect can be obtained in the case of using an InI$_x$ film, a HgI$_2$ film and a SnI$_2$ film.

EXAMPLE 6

Figure 8:
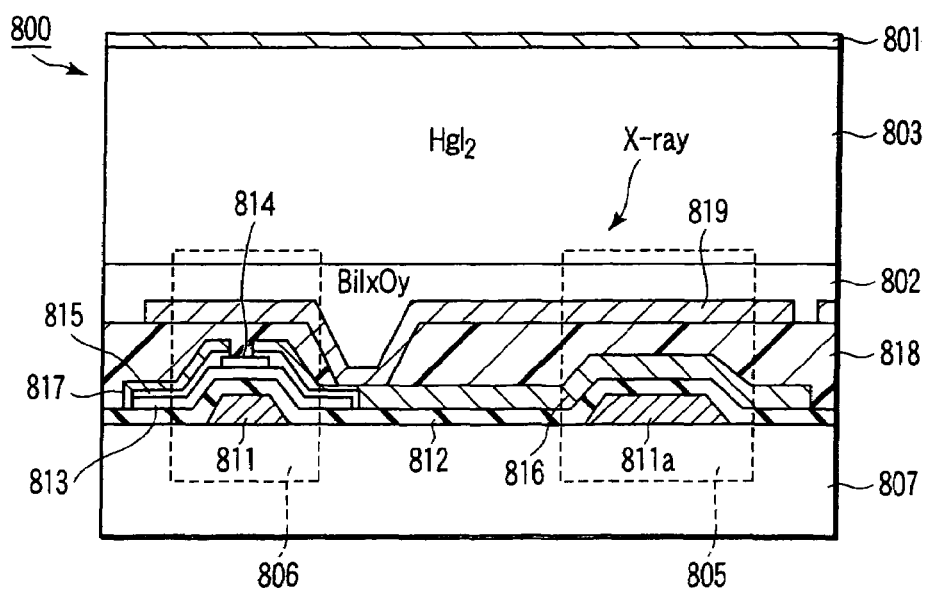
FIG. 8 is a cross sectional view showing another example of the flat panel X-ray detector according to the first embodiment of the present invention.

FIG. 8 is a cross sectional view showing the construction of a flat panel X-ray detector 800 for this Example. It should be noted that reference numerals 800 to 819 shown in FIG. 8 correspond to the reference numerals 600 to 619 shown in FIG. 6, respectively.

The flat panel X-ray detector 800 shown in FIG. 8 differs from the flat panel X-ray detector 600 shown in FIG. 6 in that the blocking film 802 is in contact with the pixel electrode 819, not in contact with the upper electrode 801, in the flat panel X-ray detector 800 shown in FIG. 8. Incidentally, a HgI$_2$ film is used as the X-ray-electric-charge converting film 803 in the flat panel X-ray detector 800 shown in FIG. 8.

How to manufacture the flat panel X-ray detector 800 for Example 6 will now be described with reference to FIG. 8. In the first step, a single layer film made of for example, MoTa, Ta, TaN, Al, an Al alloy, Cu, or MoW, or a film of two layers made of Ta and TaN$_x$, respectively, was deposited in a thickness of about 300 nm on a glass substrate 807, followed by selectively etching the deposited film so as to pattern the film. As a result, formed were a gate electrode 811 of a switching TFT 806, a scanning line (not shown), an electrode 811a of a capacitor 805, and a capacitor line (not shown).

In the next step, a SiO$_y$ film and a SiN$_x$ film were successively deposited in a thickness of about 300 nm and about 50 nm, respectively, by a plasma CVD method so as to form an insulating film 812 of a laminate structure on the entire surface. Then, an undoped a-Si layer 813 was deposited on the insulating film 812 in a thickness of about 100 nm, followed by depositing a SiN$_x$ film on the undoped a-Si layer 813 in a thickness of about 200 nm so as to form a stopper 814.

The stopper 814 was patterned by a back exposure method to conform with the gate electrode 811, followed by depositing an n$^+$-type a-Si layer 815 on the patterned stopper 814 in a thickness of about 50 nm. Further, the undoped a-Si layer 813 and the n$^+$-type a-Si layer 815 were selectively etched in conformity with the shape of the transistor so as to form an a-Si island.

In the next step, the insulating film 812 in the contact portions both inside and outside the pixel area was selectively etched so as to form contact holes. Then, a Mo layer about 50 nm thick, an Al layer about 350 nm thick, and an additional Mo layer about 20 nm to about 50 nm thick were successively laminated one upon the other by a sputtering method so as to form an auxiliary electrode 816, a signal line 817, a source-drain of the switching TFT 806, and the other wirings.

In the next step, a $SiN_x$ film was deposited in a thickness of about 200 nm, followed by depositing on the $SiN_x$ film an acrylic organic resin film (HRC: trade name, manufactured by Nippon Synthetic Rubber Inc.) in a thickness of about 1 µm to about 5 µm, preferably about 3.5 µm, so as to form a protective film 818 of a laminate structure. Incidentally, it is possible to use BCB (benzocyclobutene resin) in place of HRC for forming the organic resin film.

After formation of the contact hole leading to the auxiliary electrode 816, a laminate structure consisting of a Ti layer, which was 30 nm thick, and a Pd layer, which was 200 nm thick, was formed, followed by patterning the laminate structure so as to form a pixel electrode. Then, a $BiO_y$ layer forming the blocking film 802 was formed by a vapor deposition method on the patterned pixel electrode in a thickness of 1 to 10 µm, preferably 3 µm. Further, a $HgI_2$ film used as the X-ray-electric-charge converting film 803 was formed by a vapor deposition method on the $BiO_y$ film in a thickness of 300 µm. Still further, a Cr layer was formed on the entire surface of the X-ray-electric-charge converting film 803 so as to form the upper electrode 801.

A flat panel X-ray detector was prepared by forming a voltage-applying electrode on the upper electrode 801 so as to form a TFT array X-ray-electric-charge converting film substrate, followed by mounting the peripheral circuit as shown in FIG. 7 to the TFT array X-ray-electric-charge converting film substrate. An X-ray image was detected by using thus formed flat panel X-ray detector. As a result, the dark current was found to be lowered, compared with the case where a $HgI_2$ layer alone was formed as the X-ray-electric-charge converting film without forming the $BiO_y$ blocking layer on the X-ray-electric-charge converting film, so as to obtain a good SN ratio. Also, it was possible to obtain an X-ray image of a good image quality. The prominent effect was produced by the blocking effect of the $BiO_y$ film.

In this Example, $HgI_2$ was used for forming the X-ray-electric-charge converting film. However, it is also possible to use other metal iodides such as $PbI_2$, $InI$, $InI_3$, and $SnI_2$ or a bromide in place of $HgI_2$. Since $BiO_y$ is stable and is less reactive with a metal, the interface of the $BiO_y$ blocking layer with the metal electrode or with the ITO metal oxide layer is rendered stable. Also, since the thermal expansion coefficient of $BiO_y$ is close to that of the glass substrate, it is possible to obtain the effect of suppressing the peeling of the films formed on the glass substrate from the glass substrate.

EXAMPLE 7

Figure 9:
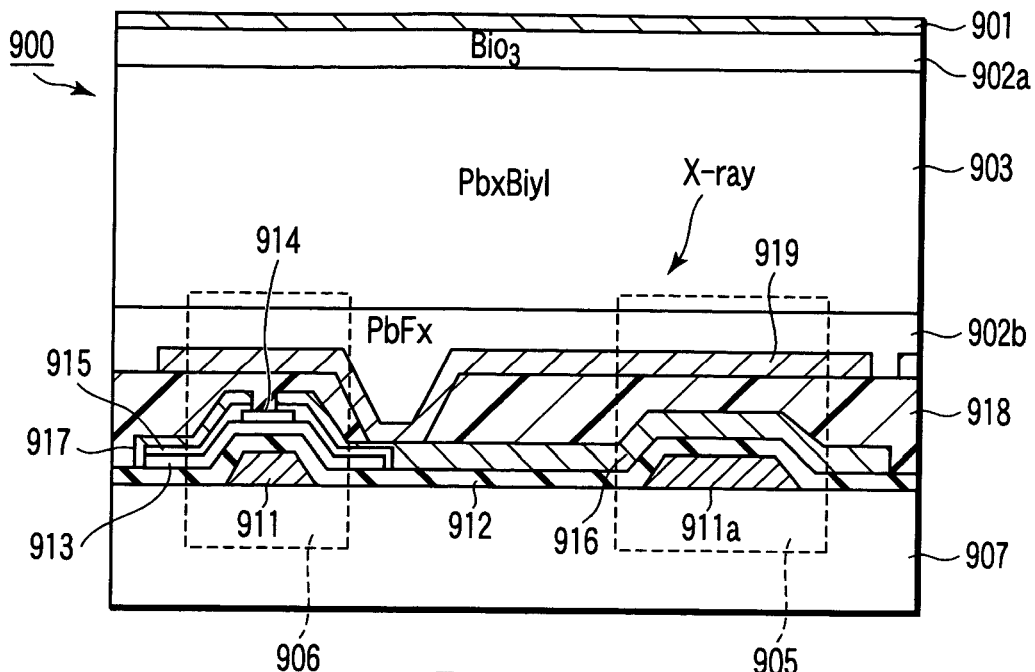
FIG. 9 is a cross sectional view showing still another example of the flat panel X-ray detector according to the first embodiment of the present invention.

This Example is directed to a flat panel X-ray detector 900 having blocking films formed on the upper and lower surfaces of an X-ray-electric-charge converting film. FIG. 9 is a cross sectional view showing the construction of the flat panel X-ray detector 900 for Example 7. It should be noted that reference numerals 900 to 919 shown in FIG. 9 correspond to the reference numerals 600 to 619 shown in FIG. 6, respectively.

The flat panel X-ray detector 900 shown in FIG. 9 differs from the flat panel X-ray detector 600 shown in FIG. 6 in that the blocking films 902a and 902b are formed in contact with the upper electrode 901 and the pixel electrode 919, respectively, in the flat panel X-ray detector 900 shown in FIG. 9, though the blocking film is formed in contact with the upper electrode alone in the flat panel X-ray detector shown in FIG. 6. Incidentally, a $Pb_xBi_yI$ film is used as the X-ray-electric-charge converting film 903, and a $BiO_3$ film and a $PbF_x$ film are used for forming the blocking films 902a and 902b, respectively, in the flat panel X-ray detector 900 shown in FIG. 9.

How to manufacture the flat panel X-ray detector 900 for Example 7 will now be described with reference to FIG. 9. In the first step, a single layer film made of, for example, MoTa, Ta, TaN, Al, an Al alloy, Cu, or MoW, or a film of two layers made of Ta and $TaN_x$, respectively, was deposited in a thickness of about 300 nm on a glass substrate 907, followed by selectively etching the deposited film so as to pattern the film. As a result, formed were a gate electrode 911 of a switching TFT 906, a scanning line (not shown), an electrode 911a of a capacitor 905, and a capacitor line (not shown).

In the next step, a $SiO_x$ film and a $SiN_x$ film were successively deposited in a thickness of about 300 nm and about 50 nm, respectively, by a plasma CVD method so as to form an insulating film 912 of a laminate structure on the entire surface. Then, an undoped a-Si layer 913 was deposited on the insulating film 912 in a thickness of about 100 nm, followed by depositing a $SiN_x$ film on the undoped a-Si layer 913 in a thickness of about 200 nm so as to form a stopper 914.

The stopper 914 was patterned by a back exposure method to conform with the gate electrode 911, followed by depositing an $n^+$-type a-Si layer 915 on the patterned stopper 914 in a thickness of about 50 nm. Further, the undoped a-Si layer 913 and the $n^+$-type a-Si layer 915 were selectively etched in conformity with the shape of the transistor so as to form an a-Si island.

In the next step, the insulating film 912 in the contact portions both inside and outside the pixel area was selectively etched so as to form contact holes. Then, a Mo layer about 50 nm thick, an Al layer about 350 nm thick, and an additional Mo layer about 20 nm to about 50 nm thick were successively laminated one upon the other by a sputtering method so as to form an auxiliary electrode 916, a signal line 917, a source-drain of the switching TFT 906, and the other wirings.

In the next step, a $SiN_x$ film was deposited in a thickness of about 200 nm, followed by depositing an acrylic organic resin film (HRC: trade name, manufactured by Nippon Synthetic Rubber Inc.) in a thickness of about 1 µm to about 5 µm, preferably about 3.5 µm, so as to form a protective film 918 of a laminate structure. Incidentally, it is possible to use BCB (benzocyclobutene resin) in place of HRC for forming the organic resin film.

After formation of the contact hole leading to the auxiliary electrode 916, a laminate structure consisting of a Ti layer, which was 30 nm thick, and a Pd layer, which was 200 nm thick, was formed, followed by patterning the laminate structure so as to form a pixel electrode. Then, a $PbF_x$ layer forming the blocking film 902b was formed by a vapor deposition method on the patterned pixel electrode in a thickness of 1 to 10 µm, preferably 2 µm. Then, a $Pb_xBi_yI$ film having a high resistivity was formed by a vapor deposition method as the X-ray-electric-charge converting film 903. Further, a PbIO film used as the blocking film 902a was formed by a vapor deposition method on the X-ray-electric-charge converting film 903 in a thickness of about 1 to 100 µm, preferably 10 µm. The film-forming temperature was set at 200° C. The $Pb_xBi_yI$ film was oriented such that the c-axes of the hexagonal system were rendered perpendicular to the substrate. The PbIO film formed a (110) orientation in a direction perpendicular to the substrate.

Further, a Cr layer was formed on the entire surface so as to form the upper electrode 901.

A flat panel X-ray detector was prepared by forming a voltage-applying electrode on the upper electrode 901 so as to form a TFT array X-ray-electric-charge converting film substrate, followed by mounting the peripheral circuit as shown in FIG. 7 to the TFT array X-ray-electric-charge converting film substrate. An X-ray image was detected by using a flat panel X-ray detector. As a result, the dark current was found to be lowered, compared with the case where a $Pb_xBi_yI$ film alone was formed as the X-ray-electric-charge converting film without forming the blocking films 902a and 902b, so as to obtain a good SN ratio. Also, it was possible to obtain an X-ray image of a good image quality. The prominent effect was produced in Example 7 because the iodide and the oxide of the same metal were used for forming the X-ray-electric-charge converting film and the blocking layer, respectively, in the manufacture of the flat panel X-ray detector so as to form an interface having an excellent property between the X-ray-electric-charge converting film and the blocking layer.

It should be noted that the thermal expansion coefficient of $PbF_x$ is smaller than that of $Pb_xBi_yI$ and is close to that of the glass substrate so as to produce the merits that the peeling of the films from the substrate is suppressed and that the adhesive force of the films to the substrate is increased. Incidentally, the thermal expansion coefficient of BiIO is smaller than that of $Pb_xBi_yI$, with the result that the peeling of the upper electrode was suppressed.

In each of Examples 5 to 7, $Pb_xBi_yI$ was used for forming the X-ray-electric-charge converting film. However, it is also possible to use a mixed crystal of metal iodides such as $HgI_2$, $BiI_3$, InI and $SnI_2$ in place of $Pb_xBi_yI$. The dark current can be decreased regardless of the polarity of the bias. However, the dark current was found to be decreased markedly in the case of applying a negative voltage to BiIO.

Incidentally, the X-ray sensitive material used in the present invention is not limited to the metal iodide and any kind of the metal halide can be used in the present invention. However, it is particularly desirable to use metal iodides such as $PbI_2$, $HgI_2$, InI, $CdI_2$, and $SnI_2$ because these metal iodides exhibit a high X-ray-electric-charge conversion efficiency and have a large X-ray absorption coefficient. It is also desirable to use the bromides and chlorides of the metal components of the metal iodides exemplified above. When it comes to the halogen component of the metal halide used in the present invention, it is desirable to use Cl, Br and I. Particularly, it is desirable to use I, which has a large X-ray absorption coefficient.

In view of the detrimental effect given to the environment, it is desirable to use In and Sn as the metal components of the metal halides because Hg and Pb give serious detrimental effects to the environment. To be more specific, InI, $InI_3$ and $SnI_2$ are superior to $HgI_2$, $PbI_2$ and $CdI_2$ when used for the manufacture of the flat panel X-ray detector of the present invention.

The materials quoted above basically assume a hexagonal system and have lattice constants close to each other. In, for example, $BiI_3$, the hexagonal structure partly lacks metal atoms in the iodine (I) atoms. However, in spite of the partial lack of the iodine atoms, the hexagonal structure produces an effect of the lattice alignment substantially equal to that produced by the complete hexagonal structure.

Examples 8 to 10 given below relate to a second embodiment of the present invention.

EXAMPLE 8

Figure 10:
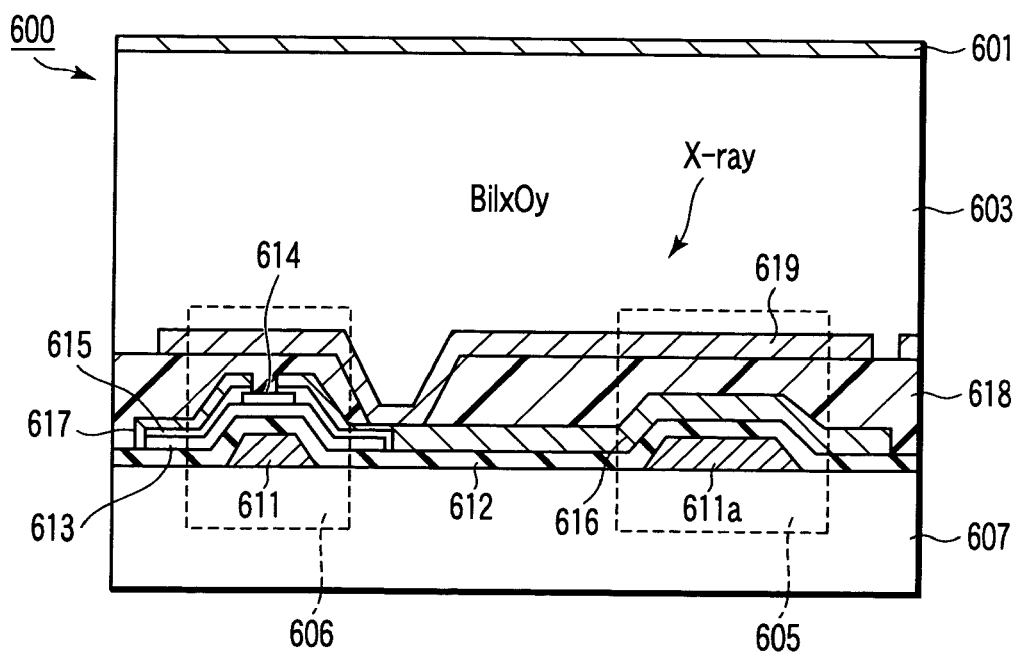
FIG. 10 is a cross sectional view showing as an example the construction of a flat panel X-ray detector according to a second embodiment of the present invention.

FIG. 10 is a cross sectional view showing the construction of a flat panel X-ray detector 600 for this Example, and FIG. 7 shows the signal detection circuit of the flat panel X-ray detector 600. The flat panel X-ray detector 600 comprises an upper electrode 601 formed on the upper surface, an X-ray-electric-charge converting film 603 formed below the upper electrode 601, and a signal detecting circuit 604 formed below the X-ray-electric-charge converting film 603. As shown in FIG. 7, the signal detecting circuit 604 has an m×n matrix arrangement.

The X-ray incident from above the upper electrode 601 passes through the upper electrode 601 so as to be converted into an electric charge within the X-ray-electric-charge converting film 603. The amount of the converted electric charge corresponds to the amount of the X-ray introduced into the X-ray-electric-charge converting film 603. The electric charge thus converted is stored in each of capacitors 605. The electric charge stored in these capacitors 605 is successively taken out to the outside through a corresponding TFT 606 by driving a shift register 701 shown in FIG. 7. A reference numeral 607 shown in FIG. 10 denotes a glass substrate. To be more specific, the electric charge can be taken out as the output signal of an amplifier 710 by sequentially applying clock signals to the column scanning lines connected to the other shift register 701 by selecting any of the row scanning lines connected to the shift register.

The method of manufacturing the flat panel X-ray detector for this Example will now be described with reference to FIG. 10. In the first step, a single layer film made of, for example, MoTa, Ta, TaN, Al, an Al alloy, Cu, or MoW, or a film of two layers made of Ta and $TaN_x$, respectively, was deposited in a thickness of about 300 nm on a glass substrate 610, followed by selectively etching the deposited film so as to pattern the film. As a result, formed were a gate electrode 611 of a switching TFT 606, a scanning line (not shown), an electrode 611a of a capacitor 605, and a capacitor line (not shown). A reference numeral 611a denotes a capacitor electrode.

In the next step, a $SiO_x$ film and a $SiN_x$ film were successively deposited in a thickness of about 300 nm and about 50 nm, respectively, by a plasma CVD method so as to form an insulating film 612 of a laminate structure on the entire surface. Then, an undoped a-Si layer 613 was deposited on the insulating film 612 in a thickness of about 100 nm, followed by depositing a $SiN_x$ film on the undoped a-Si layer 613 in a thickness of about 200 nm so as to form a stopper 614.

The stopper 614 was patterned by a back exposure method to conform with the gate electrode 611, followed by depositing an n$^+$-type a-Si layer 615 on the patterned stopper 614 in a thickness of about 50 nm. Further, the undoped a-Si layer 613 and the n$^+$-type a-Si layer 615 were selectively etched in conformity with the shape of the transistor so as to form an a-Si island.

In the next step, the insulating film 612 in the contact portions both inside and outside the pixel area was selectively etched so as to form contact holes. Then, a Mo layer about 50 nm thick, an Al layer about 350 nm thick, and an additional Mo layer about 20 nm to about 50 nm thick were successively laminated one upon the other by a sputtering method so as to form an auxiliary electrode 616, a signal line 617, a source-drain of the switching TFT 606, and the other wirings.

In the next step, a $SiN_x$ film was deposited in a thickness of about 200 nm, followed by depositing an acrylic organic resin film (HRC: trade name, manufactured by Nippon Synthetic Rubber Inc.) in a thickness of about 1 μm to about 5 μm, preferably about 3.5 μm, so as to form a protective film 618 of a laminate structure. Incidentally, it is possible to use BCB (benzocyclobutene resin) in place of HRC for forming the organic resin film.

After formation of the contact hole leading to the auxiliary electrode 616, an ITO film was formed in a thickness of 100 nm by a sputtering method with ITO used as a target, followed by patterning the ITO film so as to obtain a pixel electrode 619. The ITO film can be formed by another method such as a vapor deposition method. Also, it is possible for the ITO to be either amorphous or polycrystalline.

In the next step, a $BiI_xO_y$ film having a high resistivity and used as the X-ray-electric-charge converting film 603 was formed by a vapor deposition method on the pixel electrode 619 in a thickness of about 100 to 1,000 μm, preferably about 300 μm. It is possible for the ranges of x and y for $BiI_xO_y$ forming the X-ray-electric-charge converting film noted above to be 3>x>0 and 1.5>y>0. In terms of the characteristics, it is desirable for y to assume the values of 0.05 to 1.45. In this case, x satisfies the relationship of 3−2y and assumes the values of 2.9 to 0.1. More preferably, y assumes the values of 0.8 to 1.2.

Further, a Pd layer was deposited in a thickness of 200 nm on the $BiI_xO_y$ film 603 forming the X-ray-electric-charge converting film. The Pd layer was deposited on substantially the entire surface of a region that was 1 cm apart from the periphery of the oxide film of $BiI_3$ so as to form the upper electrode 601.

A flat panel X-ray detector was prepared by forming a voltage-applying electrode on the upper electrode 601 so as to form a TFT array X-ray-electric-charge converting film substrate, followed by mounting the peripheral circuit as shown in FIG. 7 to the TFT array X-ray-electric-charge converting film substrate. An X-ray image was detected by using thus formed X-ray detector. As a result, the dark current was found to be lowered so as to obtain a good SN ratio. Also, it was possible to obtain an X-ray image of a good image quality. Further, the sensitivity was good.

For example, where the thickness of the $BiI_xO_y$ film used as the X-ray-electric-charge converting film was 400 μm, it was possible to absorb 90% of the X ray, and the sensitivity was 30 $(pC/cm^2)/(nC/kg)$.

The metal iodide oxide containing Sb as the metal component was also found to be satisfactory. Also, the metal halide oxide containing Cl or Br as the halogen component in place of iodine (I) was also found to be satisfactory. In this case, however, the X-ray absorption coefficient was smaller than that in the case of using iodine as the halogen component so as to make it necessary to increase slightly the thickness of the film.

EXAMPLE 9

Figure 11:
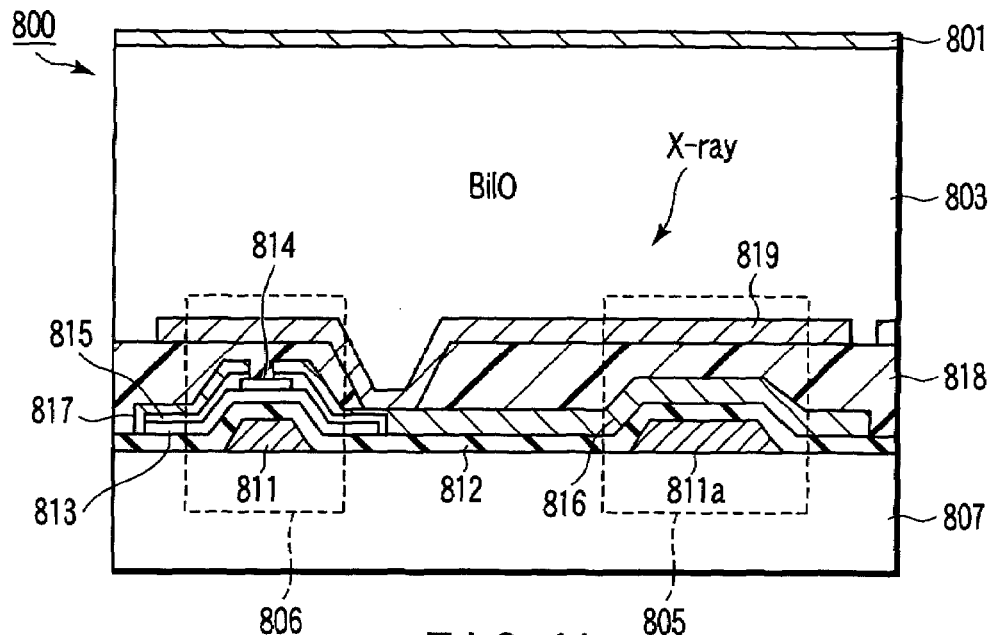
FIG. 11 is a cross sectional view showing another example of the flat panel X-ray detector according to the second embodiment of the present invention.

FIG. 11 is a cross sectional view showing the construction of a flat panel X-ray detector 800 for this Example. It should be noted that reference numerals 800 to 819 shown in FIG. 11 correspond to the reference numerals 600 to 619 shown in FIG. 10, respectively.

The flat panel X-ray detector 800 shown in FIG. 11 differs from the flat panel X-ray detector 600 shown in FIG. 10 in that a BiIO film was used as the X-ray-electric-charge converting film 803 in the flat panel X-ray detector 800 shown in FIG. 11.

How to manufacture the flat panel X-ray detector 800 for Example 9 will now be described with reference to FIG. 11. In the first step, a single layer film made of, for example, MoTa, Ta, TaN, Al, an Al alloy, Cu, or MoW, or a film of two layers made of Ta and $TaN_x$, respectively, was deposited in a thickness of about 300 nm on a glass substrate 810, followed by selectively etching the deposited film so as to pattern the film. As a result, formed were a gate electrode 811 of a switching TFT 806, a scanning line (not shown), an electrode 811a of a capacitor 805, and a capacitor line (not shown).

In the next step, a $SiO_x$ film and a $SiN_x$ film were successively deposited in a thickness of about 300 nm and about 50 nm, respectively, by a plasma CVD method so as to form an insulating film 812 of a laminate structure on the entire surface. Then, an undoped a-Si layer 813 was deposited on the insulating film 812 in a thickness of about 100 nm, followed by depositing a $SiN_x$ film on the undoped a-Si layer 813 in a thickness of about 200 nm so as to form a stopper 814.

The stopper 814 was patterned by a back exposure method to conform with the gate electrode 811, followed by depositing an $n^+$-type a-Si layer 815 on the patterned stopper 814 in a thickness of about 50 nm. Further, the undoped a-Si layer 813 and the $n^+$-type a-Si layer 815 were selectively etched in conformity with the shape of the transistor so as to form an a-Si island.

In the next step, the insulating film 812 in the contact portions both inside and outside the pixel area was selectively etched so as to form contact holes. Then, a Mo layer about 50 nm thick, an Al layer about 350 nm thick, and an additional Mo layer about 20 nm to about 50 nm thick were successively laminated one upon the other by a sputtering method so as to form an auxiliary electrode 816, a signal line 817, a source-drain of the switching TFT 806, and the other wirings.

In the next step, a $SiN_x$ film was deposited in a thickness of about 200 nm, followed by depositing an acrylic organic resin film (HRC: trade name, manufactured by Nippon Synthetic Rubber Inc.) in a thickness of about 1 μm to about 5 μm, preferably about 3.5 μm, so as to form a protective film 818 of a laminate structure. Incidentally, it is possible to use BCB (benzocyclobutene resin) in place of HRC for forming the organic resin film.

After formation of the contact hole leading to the auxiliary electrode 816, a laminate structure consisting of a Ti layer, which was 30 nm thick, and a Pd layer, which was 200 nm thick, was formed, followed by patterning the laminate structure so as to form a pixel electrode.

An ITO target film was formed by a sputtering method in a thickness of 100 nm, followed by patterning the ITO film. The ITO film can be formed by another method such as a vapor deposition method. Also, it is possible for the ITO film to be amorphous.

In the next step, a $BiI_3$ film having a high resistivity was formed by a vapor deposition method on the entire surface in a thickness of about 5 to 1,000 μm, preferably 300 μm. Then, the $BiI_3$ film was oxidized so as to form a BiIO film used as the X-ray-electric-charge converting film 803. The BiIO film was formed by the thermal oxidation method that was carried out under an atmosphere containing an oxygen gas. It is possible for the process temperature for forming the BiIO film to fall within a range of between room temperature and 150° C. It is also possible to carry out the treatment within water or an aqueous solution for achieving the oxidation for forming the BiIO film.

For forming the BiIO film, it is possible to use any kind of the aqueous system as far as the aqueous system contains water. Also, it is possible for the process temperature for forming the BiIO film to fall within a range of between room temperature and 100° C. It is also possible to carry out the oxidizing treatment within a gas plasma containing oxygen for forming the BiIO film.

Further, a Pd layer was formed on the X-ray-electric-charge converting film 803 so as to form the upper electrode 801 without patterning the Pd layer. The Pd layer was formed substantially on the entire surface of the region that was 1 cm apart from the periphery of the BiIO film used as the X-ray-electric-charge converting film.

A flat panel X-ray detector was prepared by forming a voltage-applying electrode on the upper electrode 801 so as to form a TFT array X-ray-electric-charge converting film substrate, followed by mounting the peripheral circuit as shown in FIG. 7 to the TFT array X-ray-electric-charge converting film substrate. An X-ray image was detected by using thus formed X-ray detector.

As a result, a good SN ratio was obtained even if the dark current was lowered, compared with the case of using the $BiI_3$ film as the X-ray-electric-charge converting film. Also, it was possible to obtain an X-ray image of a good image quality. The dark current can be lowered regardless of the polarity of the bias. However, the dark current can be particularly lowered in the case of applying a negative voltage to the electrode on the side of the oxidized $BiI_3$ film.

It was possible to obtain a good sensitivity of 1 ($pC/cm^2$)/(nC/kg) in the case of the BiIO film having a thickness of 5 µm. According to the X-ray diffractometry, the BiIO film was found to be a film in which the (110) direction and the (200) direction were the main orienting directions.

EXAMPLE 10

Figure 12:
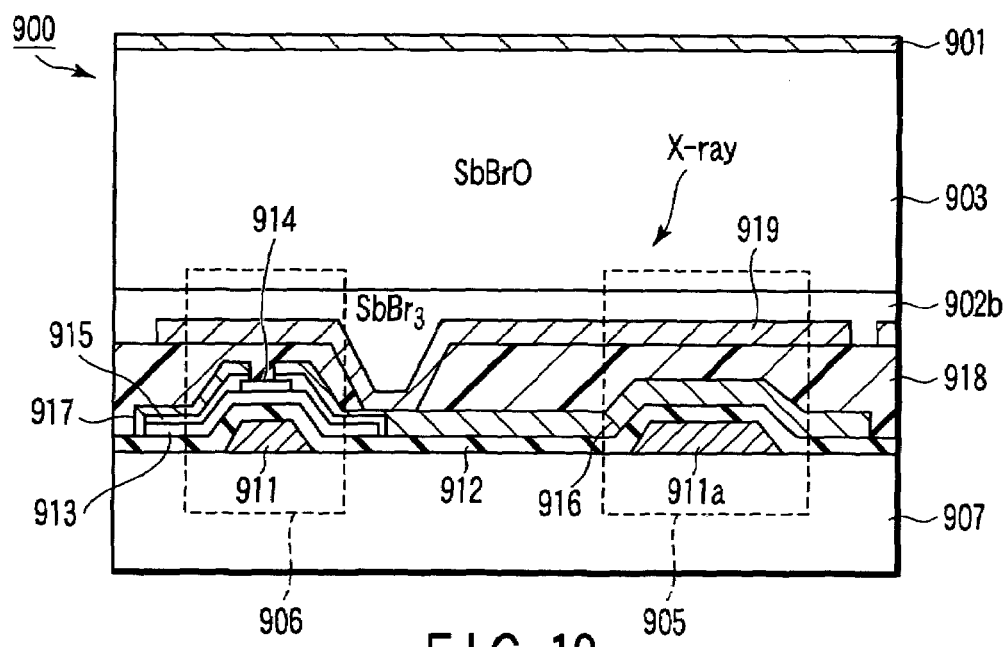
FIG. 12 is a cross sectional view showing still another example of the flat panel X-ray detector according to the second embodiment of the present invention.

This Example is directed to an X-ray-electric-charge converting film comprising a SbBrO film as the X-ray-electric-charge converting film. FIG. 12 is a cross sectional view showing the construction of the flat panel X-ray detector for Example 10. It should be noted that reference numerals 900 to 919 shown in FIG. 12 correspond to the reference numerals 600 to 619 shown in FIG. 10.

The flat panel X-ray detector 900 shown in FIG. 12 differs from the flat panel X-ray detector 600 shown in FIG. 10 in that a blocking film 902b formed is also in contact with a pixel electrode 919 in the flat panel X-ray detector 900 shown in FIG. 12. Incidentally, a $SbBr_xO_y$ film is used as the X-ray-electric-charge converting film 903, and a $SbBr_3$ film is used as the blocking film 902b in the flat panel X-ray detector 900 shown in FIG. 12.

How to manufacture the flat panel X-ray detector 900 for Example 10 will now be described with reference to FIG. 12. In the first step, a single layer film made of, for example, MoTa, Ta, TaN, Al, an Al alloy, Cu, or MoW, or a film of two layers made of Ta and $TaN_x$, respectively, was deposited in a thickness of about 300 nm on a glass substrate 910, followed by selectively etching the deposited film so as to pattern the film. As a result, formed were a gate electrode 911 of a switching TFT 906, a scanning line (not shown), an electrode 911a of a capacitor 905, and a capacitor line (not shown).

In the next step, a $SiO_x$ film and a $SiN_x$ film were successively deposited in a thickness of about 300 nm and about 50 nm, respectively, by a plasma CVD method so as to form an insulating film 912 of a laminate structure on the entire surface. Then, an undoped a-Si layer 913 was deposited on the insulating film 912 in a thickness of about 100 nm, followed by depositing a $SiN_x$ film on the undoped a-Si layer 913 in a thickness of about 200 nm so as to form a stopper 914.

The stopper 914 was patterned by a back exposure method to conform with the gate electrode 911, followed by depositing an $n^+$-type a-Si layer 915 on the patterned stopper 914 in a thickness of about 50 nm. Further, the undoped a-Si layer 913 and the $n^+$-type a-Si layer 915 were selectively etched in conformity with the shape of the transistor so as to form an a-Si island.

In the next step, the insulating film 912 in the contact portions both inside and outside the pixel area was selectively etched so as to form contact holes. Then, a Mo layer about 50 nm thick, an Al layer about 350 nm thick, and an additional Mo layer about 20 nm to about 50 nm thick were successively laminated one upon the other by a sputtering method so as to form an auxiliary electrode 916, a signal line 917, a source-drain of the switching TFT 906, and the other wirings.

In the next step, a $SiN_x$ film was deposited in a thickness of about 200 nm, followed by depositing an acrylic organic resin film (HRC: trade name, manufactured by Nippon Synthetic Rubber Inc.) in a thickness of about 1 µm to about 5 µm, preferably about 3.5 µm, so as to form a protective film 918. Incidentally, it is possible to use BCB (benzocyclobutene resin) in place of HRC for forming the organic resin film.

After formation of the contact hole leading to the auxiliary electrode 916, a laminate structure consisting of a Ti layer, which was 40 nm thick, and a Pd layer, which was 200 nm thick, was formed, followed by patterning the laminate structure so as to form a pixel electrode. Then, a $SbBr_3$ film having a high resistivity was formed on the pixel electrode by a vapor deposition in a thickness of about 5 to 1,000 µm, preferably 300 µm, followed by oxidizing the $SbBr_3$ film so as to form a SbBrxOy film. The composition of SbBrxOy can be adjusted according to the property of the SbBrxOy film and SbBrO film is used for one of best example. The SbBrO film was formed by the thermal oxidation of the $SbBr_3$ film under an atmosphere containing an oxygen gas. It is also possible to carry out the oxidizing treatment within water or an aqueous solution.

Any kind of the aqueous system can be used for the oxidizing treatment noted above as far as the aqueous system contains water. It is possible for the process temperature for forming the SbBrO film to fall within a range of between room temperature and 100° C. It is also possible to carry out the oxidizing treatment for forming the $SbBr_xO_y$ film within a gas plasma containing oxygen. In this case, that portion of the $SbBr_3$ film which was 5 to 30 µm thick as measured from the side of the pixel electrode was not oxidized so as to maintain the $SbBr_3$ film.

Further, a Pd layer was formed in a thickness of 200 nm on the SbBrO film. The Pd layer was formed on substantially the entire surface of the SbBrO film in a region that was 1 cm apart from the periphery of the SbBrO film so as to form the upper electrode 901 without patterning the Pd layer.

A flat panel X-ray detector was prepared by forming a voltage-applying electrode on the upper electrode 901 so as to form a TFT array X-ray-electric-charge converting film substrate, followed by mounting the peripheral circuit as shown in FIG. 7 to the TFT array X-ray-electric-charge converting film substrate. An X-ray image was detected by using thus formed X-ray detector. As a result, the dark current was lowered, compared with the case where the $SbBr_3$ layer was not oxidized, so as to obtain a good SN ratio.

Also, it was possible to obtain an X-ray image of a good quality. The dark current can be lowered regardless of the polarity of the bias. However, the dark current was markedly lowered in the case where a positive voltage was applied to the electrode on the side of the $SbBr_3$ region that was not oxidized.

In Example 10, it is possible to change appropriately the thickness of the $SbBr_3$ film that was not oxidized. Also, it is possible for a transition region of $SbBr_xO_y$ to be present in the interface between the oxidized SbBrO region and the $SbBr_3$ region. It is also possible to use $SbI_xO_y$ in place of SbBrO. The ranges of x and y for $SbBr_xO_y$ and $SbI_xO_y$ should be $3>x>0$ and $1.5>y>0$. Good characteristics were also exhibited in the cases where Bi was used in place of Sb and where Cl or I was used in place of Br. Further, it is possible to use $Sb_aBi_{(1-a)}$ in place of Sb.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A flat panel X-ray detector, comprising:
   an X-ray-electric-charge converting film containing a metal halide and serving to convert an incident X-ray into an electric charge;
   a pair of electrodes formed on both surfaces of the X-ray-electric-charge converting film; and
   a blocking layer formed in contact with at least one surface of the X-ray-electric-charge converting film and containing a substance selected from the group consisting of a metal oxide, a metal nitride, a metal halide oxide, a first mixture of at least two of these materials, and a second mixture of a metal halide and any of these materials.

2. The flat panel X-ray detector according to claim 1, wherein the metal halide contained in the X-ray-electric-charge converting film is at least one compound selected from the group consisting of an iodide, a chloride and a bromide of at least one metal selected from the group consisting of Pb, Hg, Tl, Bi, Cd, In, Sn, and Sb, and the metal component of the metal oxide, metal nitride and metal halide oxide, which are contained in the blocking layer, is at least one metal selected from the group consisting of Pb, Hg, Tl, Bi, Cd, In, Sn and Sb.

3. The flat panel X-ray detector according to claim 1, wherein the metal component of the metal oxide, metal nitride and metal halide oxide, which are contained in the blocking layer, is equal to the metal component of the metal halide contained in the X-ray-electric-charge converting film.

4. The flat panel X-ray detector according to claim 1, wherein the X-ray-electric-charge converting film contains at least one kind of the metal iodide selected from the group consisting of $PbI_2$, $HgI_2$, $SnI_2$, $BiI_3$, $InI$ and $InI_3$, and the blocking layer contains an oxide of the metal iodide.

5. The flat panel X-ray detector according to claim 1, wherein the X-ray-electric-charge converting film contains $BiI_3$ and the blocking layer contains $BiO_x$.

6. The flat panel X-ray detector according to claim 1, wherein the X-ray-electric-charge converting film contains $BiI_3$ and the blocking layer contains a mixture of $BiI_x$ and $BiO_y$.

7. The flat panel X-ray detector according to claim 1, wherein the blocking layer contains $BiI_xO_y$ ($3>x>0$, $1.4>y>0$).

8. The flat panel X-ray detector according to claim 5, wherein the blocking layer contains BiIO.

9. The flat panel X-ray detector according to claim 1, wherein the flat panel X-ray detector is operated when a negative voltage is applied to the electrode in contact with the blocking layer.

10. A flat panel X-ray detector, comprising:
    an X-ray-electric-charge converting film containing a metal halide and serving to convert an incident X-ray into an electric charge;
    a pair of electrodes formed on both surfaces of the X-ray-electric-charge converting film; and
    a blocking layer formed in contact with at least one surface of the X-ray-electric-charge converting film, said blocking layer being formed by oxidizing the surface region of the X-ray-electric-charge converting film.

11. The flat panel X-ray detector according to claim 10, wherein the metal halide contained in the X-ray-electric-charge converting film is at least one compound selected from the group consisting of an iodide, a chloride and a bromide of at least one metal selected from the group consisting of Pb, Hg, Tl, Bi, Cd, In, Sn and Sb.

12. The flat panel X-ray detector according to claim 10, wherein the blocking layer contains a metal halide oxide on the side in contact with the X-ray-electric-charge converting film and a metal oxide on the surface on the side opposite to the X-ray-electric-charge converting film.

13. The flat panel X-ray detector according to claim 12, wherein the blocking layer contains $BiI_xO_y$ ($3>x>0$, $1.5>y>0$) on the side in contact with the X-ray-electric-charge converting film and also contains $BiO_y$ on the surface on the side opposite to the X-ray-electric-charge converting film.

14. A flat panel X-ray detector, comprising:
    an X-ray-electric-charge converting film containing a metal halide oxide and serving to convert an incident X-ray into an electric charge; and
    a pair of electrodes formed on both surfaces of the X-ray-electric-charge converting film.

15. The flat panel X-ray detector according to claim 14, wherein the metal halide oxide is selected from the group consisting of an iodide oxide, a chloride oxide and a bromide oxide of a metal selected from the group consisting of Pb, Hg, Tl, Bi, Cd, In, Sn and Sb.

16. The flat panel X-ray detector according to claim 15, wherein the metal halide oxide is a halide oxide of Bi or Sb.

17. The flat panel X-ray detector according to claim 16, wherein the metal halide oxide is $BiI_xO_y$ ($3>x>0$, $1.5>y>0$).

18. The flat panel X-ray detector according to claim 16, wherein the metal halide oxide is $SbBr_xO_y$.

19. The flat panel X-ray detector according to claim 14, further comprising a blocking layer formed in contact with at least one surface of the X-ray-electric-charge converting film and containing a halide oxide of a metal selected from the group consisting of Pb, Hg, Tl, Bi, Cd, In, Sn and Sb.

* * * * *